(12) United States Patent
Batude et al.

(10) Patent No.: US 8,183,630 B2
(45) Date of Patent: May 22, 2012

(54) CIRCUIT WITH TRANSISTORS INTEGRATED IN THREE DIMENSIONS AND HAVING A DYNAMICALLY ADJUSTABLE THRESHOLD VOLTAGE VT

(75) Inventors: Perrine Batude, Grenoble (FR); Laurent Clavelier, Grenoble (FR); Marie-Anne Jaud, Grenoble (FR); Olivier Thomas, Revel (FR); Maud Vinet, Rives (FR)

(73) Assignee: Commissariat A L'Energie Atomique, Paris (FR)

( * ) Notice: Subject to any disclaimer, the term of this patent is extended or adjusted under 35 U.S.C. 154(b) by 0 days.

(21) Appl. No.: 12/474,851

(22) Filed: May 29, 2009

(65) Prior Publication Data

US 2009/0294822 A1    Dec. 3, 2009

(30) Foreign Application Priority Data

Jun. 2, 2008    (FR) ..................... 08 53607

(51) Int. Cl.
*H01L 29/66*    (2006.01)
*H01L 29/94*    (2006.01)

(52) U.S. Cl. . 257/337; 257/296; 257/310; 257/E21.661; 257/E21.614

(58) Field of Classification Search ........... 257/E21.614, 257/E27.098, 296, E21.661, E21.613, E27.077, 257/310, 337
See application file for complete search history.

(56) References Cited

U.S. PATENT DOCUMENTS

| | | | |
|---|---|---|---|
| 5,548,153 A | | 8/1996 | Muragishi |
| 5,559,368 A | | 9/1996 | Hu et al. |
| 5,567,959 A | * | 10/1996 | Mineji ........................ 257/69 |
| 6,579,809 B1 | * | 6/2003 | Yang et al. .................. 438/734 |
| 7,115,950 B2 | | 10/2006 | Tokushige |
| 7,511,989 B2 | | 3/2009 | Thomas et al. |
| 2004/0245577 A1 | * | 12/2004 | Bhattacharyya ............. 257/369 |
| 2005/0184292 A1 | * | 8/2005 | Kwak et al. .................... 257/70 |
| 2005/0221544 A1 | * | 10/2005 | Kwak et al. ................... 438/150 |
| 2006/0062061 A1 | * | 3/2006 | Suh et al. ....................... 365/203 |
| 2006/0208299 A1 | * | 9/2006 | Yang ............................. 257/306 |

(Continued)

FOREIGN PATENT DOCUMENTS

EP    0 920 025 A1    6/1999

(Continued)

OTHER PUBLICATIONS

Batude et al. 3D CMOS Integration: Introduction of Dynamic coupling and Application to Compact and Robust 4T SRAM. International Conference on Ic Design & Technology, France, Jun. 2-4, 2008.*

(Continued)

*Primary Examiner* — Collen A Matthews
*Assistant Examiner* — Galina Yushina
(74) *Attorney, Agent, or Firm* — Oblon, Spivak, McClelland, Maier & Neustadt, L.L.P.

(57) ABSTRACT

A microelectronic device including: a substrate surmounted by a stack of layers, at least one first transistor situated at a given level of said stack, at least one second transistor situated at a second level of said stack, above said given level, the first transistor including a gate electrode situated opposite a channel zone of the second transistor, the first transistor and the second transistor being separated by an insulating zone, and said insulating zone being constituted of several different dielectric materials include a first dielectric material and a second dielectric material.

19 Claims, 8 Drawing Sheets

U.S. PATENT DOCUMENTS

| | | | |
|---|---|---|---|
| 2007/0181880 A1 | 8/2007 | Kim | |
| 2007/0235764 A1* | 10/2007 | Chang et al. | 257/206 |
| 2008/0253180 A1* | 10/2008 | Nicolaidis et al. | 365/181 |
| 2009/0016095 A1 | 1/2009 | Thomas et al. | |
| 2009/0294861 A1* | 12/2009 | Thomas et al. | 257/368 |

FOREIGN PATENT DOCUMENTS

EP     1 705 693 A2     9/2006

OTHER PUBLICATIONS

U.S. Appl. No. 12/466,733, filed May 15, 2009, Thomas, et al.

Hyung-Kyu Lim, et al., "Threshold Voltage of Thin-Film Silicon-on-Insulator (SOI) MOSFET's", IEEE Transactions on Electron Devices, vol. ED-30, No. 10, Oct. 1983, pp. 1244-1251.

U.S. Appl. No. 12/740,907, filed Apr. 30, 2010, Thomas, et al.

Tetsu Ohtou, et al., "Variable-Body-Factor SOI MOSFET With Ultrathin Buried Oxide for Adaptive Threshold Voltage and Leakage Control", IEEE Transactions on Electron Devices, vol. 55, No. 1, Jan. 2008, pp. 40-47.

Hoon Lim, et al., "65nm High Performance SRAM Technology with $25F^2$, $0.16um^2S^3$ (Stacked Single-crystal Si) SRAM Cell, and Stacked Peripheral SSTFT for Ultra High Density and High Speed Applications", Proceedings of ESSDERC, 2005, pp. 549-552.

Ryuta Tsuchiya, et al., "Controllable Inverter Delay and Suppressing $V_{th}$ Fluctuation Technology in Silicon on Thin BOX Featuring Dual Back-Gate Bias Architecture", Electron Devices Meeting, IEDM, IEEE International, Dec. 10-12, 2007, pp. 475-478.

Yuuichi Hirano, et al., "A Novel Low-Power and High-Speed SOI SRAM With Actively Body-Bias Controlled (ABC) Technology for Emerging Generations", IEEE Transactions on Electron Devices, vol. 55. No. 1, Jan. 2008, pp. 365-371.

Fariborz Assaderaghi, et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Soon-Moon Jung, et al., "Highly Cost Effective and High Performance 65nm $S^3$ (Stacked Single-crystal Si) SRAM Technology with $25F^2$, $0.16um^2$ Cell and Doubly Stacked SSTFT Cell Transistors for Ultra High Density and High Speed Applications", Symposium on VLSI Technology Digest of Technical Papers, Jun. 2005, pp. 220-221.

Yong-Hoon Son, et al., "Laser-Induced Epitaxial Growth (LEG) Technology for High Density 3-D Stacked Memory with High Productivity", Symposium on VLSI Technology Digest of Technical Papers, Jun. 12-14, 2007, pp. 80-81.

O. Thomas, et al., "Compact 6T SRAM Cell With Robust Read/Write Stabilizing Design in 45nm Monolithic 3D IC Technology", May 2009, pp. 1-4.

P. Batude, et al., "3D CMOS Integration: Introduction of Dynamical Coupling and Application to Compact and Robust 4T SRAM", May 2008, pp. 1-4.

* cited by examiner

Background Art

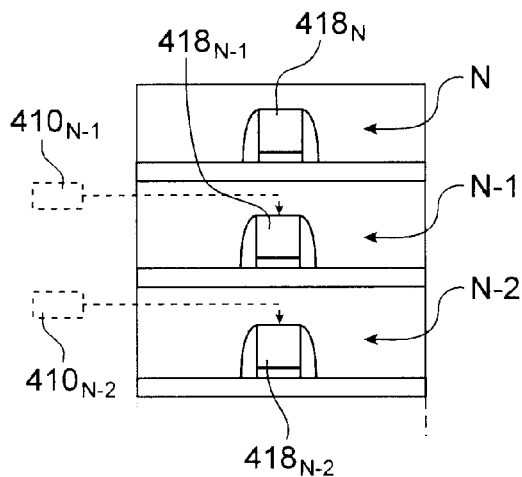
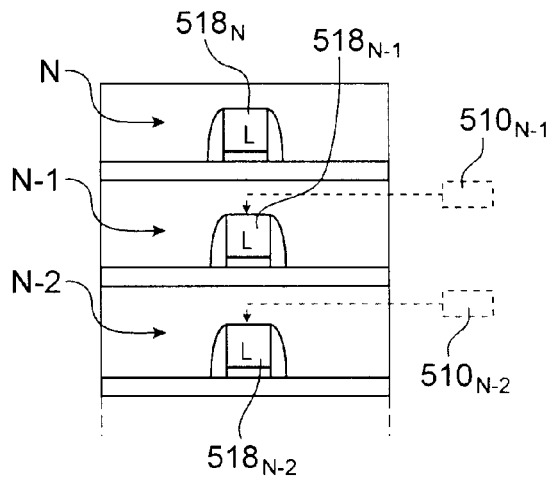
FIG.12A  FIG.12B
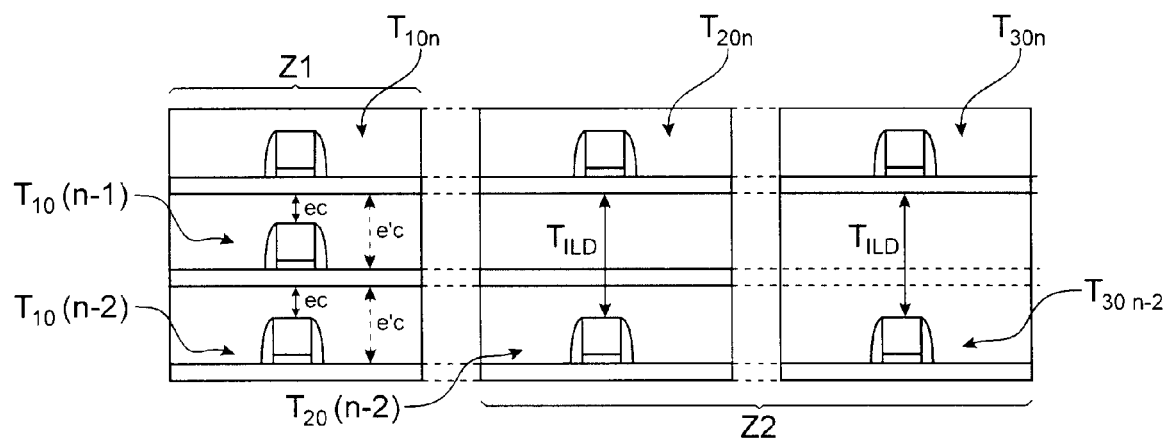
FIG.13

CIRCUIT WITH TRANSISTORS INTEGRATED IN THREE DIMENSIONS AND HAVING A DYNAMICALLY ADJUSTABLE THRESHOLD VOLTAGE VT

TECHNICAL FIELD

The present invention relates to the field of microelectronics and in particular that of devices comprising transistors distributed over several levels.

It relates to the formation of a microelectronic device provided with transistors integrated in 3 dimensions and means for modulating the threshold voltage of transistors by coupling by means of the gate of lower level transistors.

It brings improvements, particularly in terms of size, electrical performance, operating speed, and makes it possible to modify in a dynamic manner the threshold voltage of some of the transistors of the device, and to reduce the short channel effects of these transistors.

The invention applies in particular to the field of random access memories, such as SRAM memories (SRAM for "static random access memory").

STATE OF THE PRIOR ART

Generally speaking, increasing the density of components in microelectronic devices is a continual aim.

To do this, among a considerable number of possible solutions, devices in which the transistors are integrated in 3 dimensions and distributed over several levels are designed.

Document EP 1 705 693 discloses for example a device wherein a capacitance 3 is inserted between two transistors 1 and 2 distributed over two different superimposed levels. The electrodes of the capacitance 3 are placed at a fixed potential, which makes it possible to decouple the two transistors. In addition to enabling an improved integration density to be obtained, such a layout makes it possible to limit the noise generated between the different levels of transistors (FIG. 1).

Reducing the consumption of microelectronic devices is also a continual aim.

To do this, a conventional solution consists in reducing their supply voltage. However, a reduction in the supply voltage below a value around 3 times the threshold voltage of the transistors is likely to degrade in a significant manner the operating speed of said transistors. To reduce the supply voltage, it may thus be necessary to reduce the threshold voltage of the transistors. But a reduction in the threshold voltage has a tendency to bring about an increase in the static consumption.

To overcome this problem, devices in which the threshold voltage of certain transistors are modified in a dynamic manner have in particular appeared.

A dynamic modification of the threshold voltage has been carried out on double gate MOS transistor (also known as DGMOS for "Double Gate MOSFET"), MOS transistor on SOI substrate (SOI for "Silicon on Insulator") with control of the rear face voltage, or DTMOS transistor (DTMOS for "Dynamic Threshold Voltage MOSFET") architectures.

A double-gate transistor 10 may be implemented with an adjustable threshold voltage. Such an operating mode is based on a coupling between a zone of the channel 4 and the front gate 8 of the transistor, and a coupling between another zone of the channel 4 and the rear gate 6 of the transistor. In this case, the rear gate 6 of the transistor is used as control gate. Depending on the manner in which this rear gate is polarised, a modification of the threshold voltage of the transistor (FIG. 2) may be induced.

To modify the threshold voltage of a transistor, a structure known as a "ground plane" structure has also been proposed.

Such a structure makes use of SOI technology (SOI for "silicon on insulator"), and comprises a doped zone 17 situated below a position provided for a transistor 15 and below an insulating layer 16 of an SOI substrate. A suitable polarisation of this doped zone makes it possible to modify the threshold voltage of the transistor by electrostatic coupling through the insulating layer of the SOI substrate (FIG. 3).

An example of ground plane structure is given in the document U.S. Pat. No. 7,115,950.

A ground plane transistor structure, provided with a buried oxide of very low thickness, has for its part been described in the document of Tetsu Ohtou: "Variable-Body-Factor SOI MOSFET With Ultrathin Buried Oxide for Adaptative Threshold Voltage and Leakage Control", IEEE Transactions on Electron Devices, volume 55, n° 1, January 2008. Such a structure has a high capacitance between the source and drain zones and the substrate, which has a tendency to induce a degradation of the signal propagation times.

To overcome this problem, it has been proposed to modulate the coupling coefficient by modifying the state of the interface between the substrate and the buried oxide from the inversion to the depletion and vice versa by implementing a polarisation of the rear face of the substrate. In this case, a high operating speed as well as a low capacitance may be obtained in the on-mode, while at the same time guaranteeing a low consumed power in the off-state thanks to a high coupling coefficient in the off-state.

A particular transistor structure 18 known as DTMOS (DTMOS for "Dynamic Threshold Voltage MOSFET") has a connection linking its gate 20 to its body 22 as is represented in FIG. 4.

A modification of threshold voltage of the transistor 18 may be obtained in this case, by modifying the polarisation of the gate 20. The gate 20-body 22 connection makes it possible to lower the threshold voltage $V_T$ of the transistor 18 in the on-state, the threshold voltage resuming its original, higher value in the off-state. The operation of the DTMOS transistor is limited to a low supply voltage, for example less than 0.7V on account of the creation of a parasite bipolar for high supply voltages.

Document U.S. Pat. No. 5,567,959 discloses a microelectronic device with superimposed TFT transistors in which the gate of a first TFT transistor is electrically coupled to the channel of a second TFT transistor resting on said first transistor and separated from it by means of a layer of dielectric material. The layout of the device is such that it poses problems of planeness and that a parasite electrical coupling can be established between the access zones of the first transistor and the second transistor, which has a tendency to reduce the operating speed of the device.

The problem is posed of finding a novel microelectronic device with superimposed transistors, which meets at the same time the criteria of reduced integration density and low consumption and brings improvements in terms of electrical performance.

DESCRIPTION OF THE INVENTION

The invention firstly relates to a microelectronic device with superimposed transistors comprising:
- a substrate surmounted by a stack of layers,
- at least one first transistor situated at a given level of said stack,
- at least one second transistor situated at a second level of said stack, above said given level, the first transistor comprising a gate electrode situated opposite a channel zone of the second transistor, the first transistor and the second transistor being separated by an insulating zone, said insulating zone having, in a first region situated between said gate of said first transistor and said channel of said second transistor, a given composition and thickness, and in a second region situated between at least one access zone of the first transistor and at least one other access zone of the second transistor, a thickness and a composition different to those of said first region.

The first region of the insulating zone is provided so as to enable a coupling between the gate electrode of the first transistor and the channel of the second transistor.

Between the respective access zones of the first transistor and the second transistor, the second region of the insulating zone may be provided, by virtue of its composition and its thickness, so as to limit a coupling between at least one access zone, in other words a source or drain zone, and at least one access zone (source or drain) of the second transistor.

Access zone is taken to mean a source or drain zone of a transistor.

The invention also relates to a microelectronic device comprising:
a substrate surmounted by a stack of layers,
at least one first transistor situated at a given level of said stack,
at least one second transistor situated at a second level of said stack, above said given level, the first transistor comprising a gate electrode situated opposite a channel zone of the second transistor, the first transistor and the second transistor being separated by means of an insulating zone,
said insulating zone being constituted of several different dielectric materials and having, in a first region between said gate of said first transistor and said channel of said second transistor, a composition and a thickness provided so as to form a first electric capacitance C1 between the gate electrode of the first transistor and the channel of the second transistor, said insulating zone comprising a second region between at least one access zone of the first transistor and at least one access zone of the second transistor, of composition and thickness provided so as to form a second electric capacitance C2 between said access zone of the first transistor and said access zone of the second transistor, such that C2<C1.

The insulating zone may form, in the first region, a first capacitance C1 enabling a coupling between the gate of the first transistor and the channel of the second transistor.

The insulating zone may form, in the second region between said access zone of said first transistor and said access zone of said second transistor, a capacitance C2 limiting the coupling between said access zone of the first transistor and said access zone of the second transistor.

Thus, the threshold voltage of the second transistor may be modulated by coupling with the first transistor by providing a first region of the insulating zone of given dielectric properties and thickness, while at the same time limiting or preventing an inopportune coupling between the respective access zones of the first and the second transistor, by providing a second region of the insulating zone, of different dielectric properties and thickness to those of the first region.

On account of the coupling between the gate of the first transistor and the channel zone of the second transistor, the second transistor may have a threshold voltage dependent on the polarisation of the gate of the first transistor.

The device also comprises polarisation means to apply a potential to the gate of the first transistor, in particular a variable potential.

Thus, the device according to the invention may comprise means to modulate the threshold voltage of the second transistor, said means comprising polarisation means to apply a potential to the gate of the first transistor, in particular a variable potential.

A dynamic modification of the threshold voltage $V_T$ of the second transistor may for example consist,
in imposing on the second transistor, by means of a potential applied to the first transistor, a first threshold voltage $V_{T1}$,
in imposing on the second transistor, by means of another potential applied to the first transistor, a threshold voltage $V_{T2}$, greater than the first threshold voltage $V_{T1}$.

The first threshold voltage is preferably a low threshold voltage, whereas the second threshold voltage is preferably a high threshold voltage.

Thus, in order to vary the threshold voltage of the second transistor, said means of polarisation may be implemented:
during at least one first phase, to apply to the gate of the first transistor, at least one first potential, said second transistor then having a first threshold voltage $V_{T1}$,
during at least one second phase, to apply to the gate of the first transistor, at least one second potential different to said first potential, said second transistor then having a second threshold voltage $V_{T2}$ different to the first threshold voltage $V_{T1}$.

According to one possibility, the first potential may be a potential provided to turn on the first transistor, the second potential being provided to turn off the first transistor.

The microelectronic device according to the invention may thus comprise means for modulating the threshold voltage of the second transistor by varying the gate potential of the first transistor.

The insulating zone has, in the first region, a sufficiently low thickness $e_c$ to enable a coupling between the gate electrode of the first transistor and the channel of the second transistor.

The insulating zone may have, in the first region, an equivalent silicon oxide thickness EOT less than 20 nanometres.

The insulating zone is in particular provided to enable a coupling such that a variation in the gate potential of the first transistor brings about a variation in the threshold voltage of the second transistor.

The coupling may be such that a variation in the gate potential of the first transistor of at the most Vdd (where Vdd is a supply voltage of the device) makes it possible to obtain a variation in the threshold voltage of the second transistor of at least 50 mV.

The thickness as well as the dielectric materials of the insulating zone are chosen to enable a coupling between the gate electrode of the first transistor and the channel of the second transistor.

The thickness as well as the dielectric materials of the insulating zone may also be chosen to make it possible to prevent a coupling between the access zones of the first transistor and those of the second transistor.

The insulating zone may thus have, in the second region, between the access zones of the first transistor and those of the second transistor, an equivalent silicon oxide thickness EOT greater than 60 nanometres.

The second transistor may be formed on a fully depleted semi-conducting layer.

According to one possible embodiment of the microelectronic device, between said gate and said channel zone, said insulating zone may be formed of a first region based on a first dielectric material having a first dielectric constant $k_1$, whereas opposite the source and drain zones of said first transistor, said insulating zone is formed of a second region based on a second dielectric material having a second dielectric constant $k_2$ such that $k_2 < k_1$.

According to another possible embodiment of the microelectronic device, between said gate and said channel zone, said insulating zone may be formed of a first region based on a first dielectric material having a first dielectric constant $k_1$, whereas opposite the source and drain zones of said first transistor, said insulating zone is formed of a second region based on a stack of said first dielectric material and said second dielectric material.

According to another possible embodiment of the microelectronic device, said first region may be formed of a first stack of a first dielectric material and a second dielectric material, said second region comprising a second stack of said first dielectric material and the second dielectric material, the respective thicknesses of the first dielectric material and the second dielectric material being different in the first stack and in the second stack.

The first dielectric may be for example a dielectric commonly known as "high-k" such as $HfO_2$.

The second dielectric may be for example $SiO_2$.

It is thus possible to have a device wherein a coupling between the gate of the first transistor and the channel of the second transistor is implemented, whereas the other zones of the second transistor are fully decoupled from the first transistor.

According to one possibility, the polarisation means may be provided to apply a variable potential, between 0 and Vdd or between −Vdd and +Vdd, where Vdd is a supply potential of the device.

The microelectronic device may comprise more than two superimposed transistors.

Thus, the microelectronic device may further comprise, in an axis orthogonal to the principal plane of the substrate and passing through the gate of the first transistor and/or the second transistor, one or several other transistors.

According to one possibility, the microelectronic device may further comprise: one or several other transistors in a plane parallel to the principal plane of the substrate and passing through the gate of the first transistor and/or the gate of the second transistor.

According to one possible embodiment, the microelectronic device may further comprise: at least one contact pad between the gate of the first transistor and the gate of the second transistor.

The device may further comprise: at least one third transistor situated at the level of said first transistor in said stack, and at least one fourth transistor, a fifth decoupling transistor being situated between the third transistor and the fourth transistor.

According to an alternative, the device may further comprise: at least one third transistor situated at the level of said first transistor in said stack, at least one fourth transistor situated above the third transistor, the fourth transistor and the third transistor being separated by means of a dielectric zone provided to limit a coupling between the third transistor and the fourth transistor.

According to one possible embodiment, the device may comprise at least one transistor provided with a channel formed in a semi-conducting zone surrounded by insulating zones of thickness equal or substantially equal to the thickness of the semi-conducting zone, the gate dielectric and the gate of the first transistor, lying on said insulating zones and on the semi-conducting zone.

Such a layout can make it possible to reduce the topography of the gate and enable the impact of an involuntary misalignment between the upper and lower gate to be reduced.

The microelectronic device may be a memory cell, in particular a SRAM memory cell.

The invention also relates to a method of forming a microelectronic device as defined above.

The invention relates to in particular a method of forming a microelectronic device comprising the steps of:

a) forming on a substrate at least one first transistor provided with a source region, a drain region, a structure forming a channel linking the source region and the drain region, and a gate on the channel, b) forming on the first transistor an insulating zone having, in a first region situated on said gate a given composition and a thickness and in a second region situated on at least one access zone of the first transistor, a composition and a thickness different to those of said first region, c) forming on the insulating zone a semi-conducting layer above the first transistor and a second transistor from said semi-conducting layer.

BRIEF DESCRIPTION OF DRAWINGS

The present invention will be better understood on reading the description of embodiments, given purely by way of indication and in no way limiting, and by referring to the appended figures in which:

FIGS. 12A-12B illustrate an example of microelectronic device according to the invention, provided with transistor gate polarisation means, provided to apply a variable potential, FIG. 13 illustrates an example of microelectronic device according to the invention, comprising, on a same substrate, superimposed transistors and coupled together with superimposed transistors, which are not coupled and separated by a level left empty;

Figure 1:
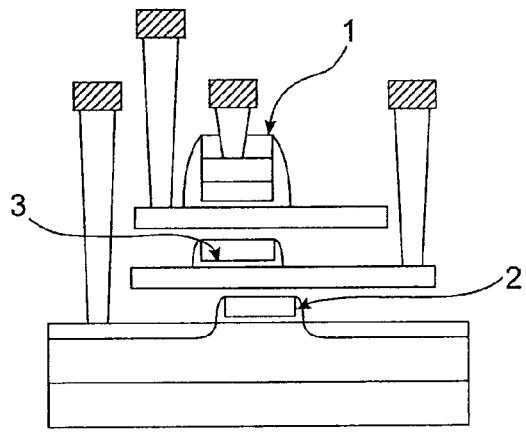
FIG. 1, illustrates an example of microelectronic device according to the prior art, provided with transistors distributed over 2 superimposed levels.
Figure 2:
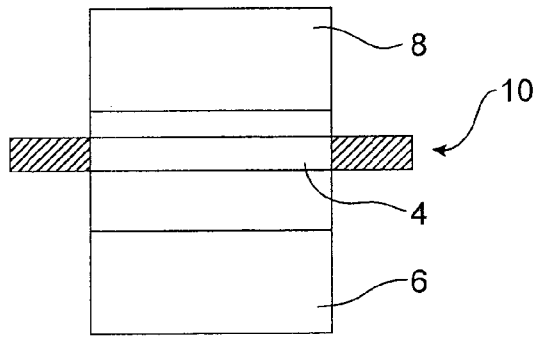
FIG. 2 illustrates an example of a double gate transistor.
Figure 3:
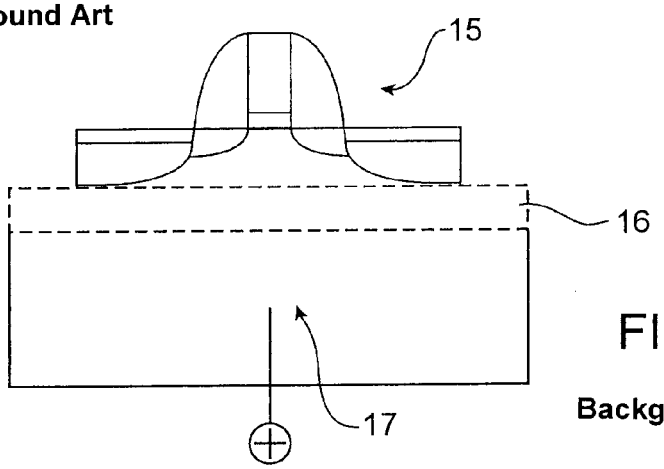
FIG. 3 illustrates an example of a transistor structure on a ground plane SOI.
Figure 4:
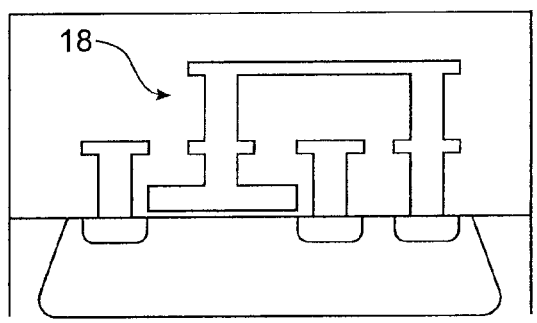
FIG. 4 illustrates an example of a DTMOS type transistor structure.

In order to make the figures easier to read, the different parts represented in the figures are not necessarily to the same scale.

DETAILED DESCRIPTION OF SPECIFIC EMBODIMENTS

An example of microelectronic device with superimposed transistors will now be given in reference to FIG. 5.

Said device firstly comprises a substrate 100, which may be a bulk substrate or semi-conductor on insulator type, for example SOI type (SOI for "silicon on insulator"), comprising a first support layer that may be semi-conducting and for example based on Si, covered by an insulating layer, for example based on $SiO_2$, itself covered by a semi-conducting layer, for example based on Si, and in which one or several active zones are capable of being formed.

On the substrate 100, lies a stack of layers in which there is a first transistor $T_{11}$ comprising access zones, in other words a source region 102 and a drain region 104, and as well as a channel zone 106 between the access zones 102, 104. The first transistor $T_{11}$ may if necessary be formed on a fully depleted or partially depleted SOI substrate.

The first transistor $T_{11}$ also comprises a gate electrode 108 situated on a layer of gate dielectric material 107.

The dielectric material 107 may have an equivalent $SiO_2$ thickness, also know as EOT (EOT for "Equivalent Oxide Thickness") for example between 0.5 and 5 nm. The dielectric material 107 may be for example $SiO_2$ or a material of type commonly known as "high-k" such as $HfO_2$.

Figure 5:
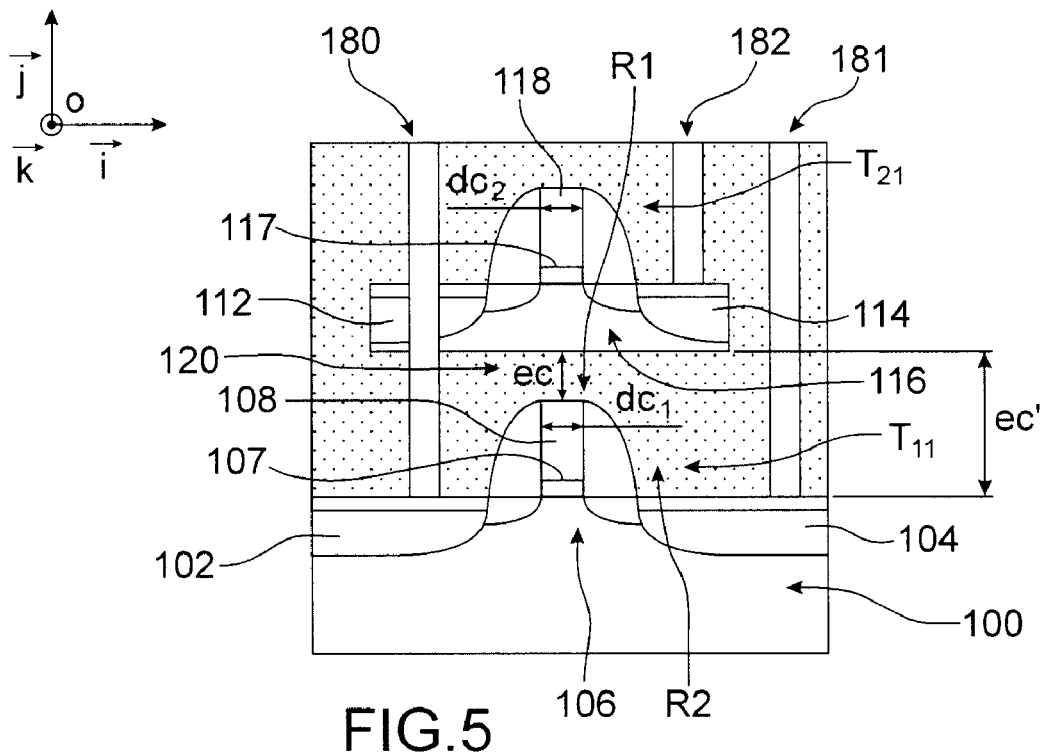
FIG. 5 illustrates an example of microelectronic device with 2 superimposed transistors, and separated by an insulating zone provided so that the channel of the upper level transistor is electrostatically coupled with the gate of the lower level transistor.

The gate 108 of the first transistor $T_{11}$, may have a critical dimension $dc_1$ between for example 10 and 1000 nanometres (the critical dimension $dc_1$ being measured in a direction parallel to that of the vector $\vec{i}$ of an orthogonal mark $[0; \vec{i}; \vec{j}; \vec{k}]$ given in FIG. 5). Throughout the present description, "critical dimension" is taken to mean the smallest dimension of a pattern except its thickness.

The gate of the first transistor $T_{11}$ may also have a thickness between for example 10 and 100 nanometres (the thickness of the gate being measured in a direction parallel to that of the vector $\vec{j}$ of an orthogonal mark $[0; \vec{i}; \vec{j}; \vec{k}]$ given in FIG. 5).

The gate 108 of the first transistor $T_{11}$ may be for example based on a doped semi-conducting material such as polysilicon, or a metal such as for example TiN.

The device also comprises at least one second transistor $T_{21}$ formed above the first transistor $T_{11}$, in a level of the stack above that of the level in which the first transistor $T_{11}$ is found.

The second transistor $T_{21}$ comprises access zones, in other words a source region 112 and a drain region 114, as well as a channel structure 116 between the access zones, which links the source region 112 and the drain region 114. The second transistor $T_{21}$ also comprises a gate 118 resting on a gate dielectric layer 117.

The gate dielectric 117 may have an equivalent $SiO_2$ thickness, also known as EOT (EOT for "Equivalent Oxide Thickness") between for example 0.5 and 5 nanometres. The gate dielectric may be for example $SiO_2$ or a material of type commonly known as "high-k" such as $HfO_2$.

The gate 118 of the second transistor $T_{21}$ may have a critical dimension $dc_2$ between for example 10 and 100 nanometres ($dc_2$ being measured in a direction parallel to that of the vector $\vec{i}$ of the orthogonal mark $[0; \vec{i}; \vec{j}; \vec{k}]$). The gate of the second transistor $T_{21}$ may also have a thickness between 10 nanometres and 1000 nanometres. The gate of the second transistor $T_{21}$ may be for example based on a semi-conducting material such as polysilicon or a metal such as for example TiN.

The first transistor $T_{11}$ and the second transistor $T_{21}$ are superimposed and separated by an insulating zone 120 known as ILD (ILD for "Inter Layer Dielectric").

The access and channel zones of the first transistor $T_{11}$ are formed in a semi-conducting layer parallel or substantially parallel to the semi-conducting layer in which the access and channel zones of the second transistor $T_{11}$ are formed.

The thickness of the insulating zone 120 separating the two transistors is variable and differs between a first region R1 of the insulating zone 120 situated between the gate of the first transistor $T_{11}$ and the channel zone of the second transistor, and another region R2 situated near to the first region R1 between the access zones of the two transistors $T_{11}$ and $T_{21}$.

The gate 108 of the first transistor $T_{11}$ and the channel zone of the second transistor $T_{21}$ are spaced apart by a chosen or predetermined distance or thickness $e_c$. The gate 108 of the first transistor $T_{11}$ and the channel zone of the second transistor $T_{21}$ are thus separated by a first region of the insulating zone 120 of low thickness $e_c$.

Between the access zones of the first transistor $T_{11}$ and those of the second transistor $T_{21}$, the insulating zone 120 has a thickness $e'_c$ such that $e'_c > e_c$.

The insulating zone 120 may be for example based on $SiO_2$ or a dielectric material commonly known as "high-k" such as $HfO_2$.

The insulating zone 120, and in particular the first region R1, is provided in terms of composition and thickness so that an electrical coupling can be established between the gate 108 of the first transistor $T_{11}$ and the channel of the second transistor $T_{21}$, situated above and opposite the gate 108 of the first transistor $T_{11}$.

Preferably, the thickness $e_c$ of the first region R1 of this insulating zone 120 is in particular chosen well below that of the thicknesses of layers of inter-layer dielectric materials in devices according to the prior art, and which in these devices is provided to make it possible to insulate from each other different superimposed levels of components or interconnection lines.

"Low" thickness $e_c$ or distance $e_c$ is taken to mean that $e_c$ may be between 1 and 50 nanometres of equivalent $SiO_2$ thickness, to enable coupling.

In addition to the thickness, the nature of the dielectric material of the insulating zone, for example $SiO_2$ or $HfO_2$, is also chosen to make it possible to obtain a coupling between the gate of the lower level transistor and the channel zone of the upper level transistor.

The equivalent $SiO_2$ thickness EOT of a "high-k" dielectric of thickness $T_{high-k}$ is obtained by the following relation:

$$EOT = \frac{\varepsilon_{SiO2}}{\varepsilon_{high-k}} \cdot T_{high-k}$$

For example, a layer of $HfO_2$ having a dielectric constant k=20 and a thickness of 200 nm, has an equivalent $SiO_2$ thickness EOT of 50 nm.

With such a device, as a function of the manner in which the polarisation of the gate 108 of the first transistor $T_{11}$ is provided, the threshold voltage $V_T$ of the channel of the second transistor $T_{21}$ may be adjusted. By means of such a device, in order to vary the threshold voltage $V_T$ of the channel of the second transistor $T_{21}$, the potential applied to the gate 108 of the lower level transistor $T_{11}$ may be varied.

The gate of the first transistor $T_{11}$ thus makes it possible to control the channel potential of the upper level transistor $T_{21}$.

The first transistor $T_{11}$ and the second transistor $T_{21}$ are arranged so that the gate 108 of the first transistor $T_{11}$ is situated opposite the semi-conducting channel zone 116 of the second transistor $T_{21}$. In this example, the gates 108 and 118 have patterns aligned in a direction orthogonal to the principal plane of the substrate (in a direction parallel to that of the vector $\vec{j}$ of the orthogonal mark $[0; \vec{i}; \vec{j}; \vec{k}]$).

Preferably, to obtain a better control of the channel potential of the second transistor $T_{21}$, the whole of the channel zone of the first transistor $T_{11}$ is arranged opposite the semi-conducting channel zone 116 of the second transistor $T_{21}$.

The channel zone 116 of the second transistor $T_{21}$ may be formed in a fully depleted semi-conducting layer, so as to enable an electrostatic control at the level of the inversion channel enabling a variation at threshold voltage. The channel zone 116 of the second transistor $T_{21}$ may be formed in a semi-conducting layer of thickness for example between 1 and 100 nm, or for example between 5 and 20 nanometres. The thickness chosen for the semi-conducting layer in which is formed the channel 116 is provided particularly as a function of the doping level of this layer to enable a fully depleted behaviour.

The channel zones of the transistors $T_{11}$ and $T_{21}$ may be formed for example of Si or another semi-conducting material, such as for example Ge.

The insulating zone separating the gate of the transistor $T_{11}$ from the semi-conducting layer on which the transistor $T_{21}$ is formed, is provided to enable a significant coupling of the gate 108 with the channel zone 116.

Significant coupling is taken to mean a coupling making it possible to vary the threshold voltage of the upper level transistor $T_{21}$ by at least 50 mV, for a variation of the voltage applied to the gate of the lower level transistor $T_{11}$ between 0 and Vdd or −Vdd and +Vdd according to the application, where Vdd is the supply voltage of the device, for example around 1 Volt or 0.5 V.

A model such as that described in the article of Lim and Fossum: IEEE Transactions on electron devices, vol. ED-30, n°10 October 1983, may be used to dimension the insulating zone 120 in order to obtain a desired $\Delta V_{th}$ threshold voltage variation when the polarisation potential of the gate 108 of the first transistor $T_{11}$ is made to vary by $\Delta V$.

Such a model may be used in particular in the case where the second transistor $T_{21}$ is formed on a fully depleted layer.

$$\Delta V_{th} = \frac{\frac{\varepsilon_{sc}}{T_{sc}} \cdot \frac{\varepsilon_{ILD}}{T_{ILD}}}{\frac{\varepsilon_{ox}}{T_{ox}} \cdot \left(\frac{\varepsilon_{sc}}{T_{sc}} + \frac{\varepsilon_{ILD}}{T_{ILD}}\right)} \cdot \Delta V$$

Where:
  $\Delta V_{th}$ is the variation in threshold voltage of the second transistor $T_{21}$,
  $\varepsilon_{sc}, T_{sc}$, are respectively the dielectric permittivity and the thickness of the semi-conducting layer in which the channel 116 of the transistor $T_{21}$ is formed,
  $\varepsilon_{ox}, T_{ox}$, are respectively the dielectric permittivity and the thickness of the gate dielectric of the second transistor $T_{21}$,
  $\varepsilon_{ILD}, T_{ILD}$, are respectively the dielectric permittivity and the thickness of the dielectric of the insulating zone 120 separating the semi-conducting layer of the second transistor $T_{21}$ from the gate 108 of the first transistor $T_{11}$.

This gives, when the potential of the gate of the first lower transistor $T_{11}$ varies from 0 to Vdd:

$$\Delta V_{th} = \frac{\frac{\varepsilon_{sc}}{T_{sc}} \cdot \frac{\varepsilon_{ILD}}{T_{ILD}}}{\frac{\varepsilon_{ox}}{T_{ox}} \cdot \left(\frac{\varepsilon_{sc}}{T_{sc}} + \frac{\varepsilon_{ILD}}{T_{ILD}}\right)} \cdot V_{DD} \quad (1)$$

To attain a significant coupling corresponding to a variation in threshold voltage $\Delta V_{th}$=50 mV, in the case where the gates 108 and 118 have a critical dimension of around 45 nm, that the thickness $T_{sc}$ of the channel zone 116 is equal to 7 nm, that said channel zone is made of silicon, that the thickness $T_{ox}$ of the dielectric zone 117 is equal to 1 nm, that said dielectric zone is based on $SiO_2$, that Vdd=1V, and that the zone 120 is made of $SiO_2$, the insulating zone 120 is provided for example with a thickness of around 17.5 nm.

To attain for example an identical coupling with an insulating zone separating the superimposed transistors based on $HfO_2$ with a permittivity of 20, the physical thickness of the "high-k" layer is around 90.5 nm.

In the case where the dielectric of the insulating zone 120 is based on a "high-k" material, the thickness $T_{high-k}$ to be provided for this insulating zone 120 is determined by the previous formula, replacing Tox by:

$$Tox = \frac{\varepsilon_{SiO2}}{\varepsilon_{high-k}} \cdot T_{high-k}$$

The first transistor $T_{11}$ and the second transistor $T_{21}$, may also be provided with siliconised access zones to the channel.

The first transistor $T_{11}$ and the second transistor $T_{21}$ may be transistors of a memory cell, in particular a SRAM memory cell.

A dynamic modification of the threshold voltage $V_T$ of the second transistor may be obtained using means (not represented in FIG. 5) to apply a variable potential, provided:
  during one phase, to apply a potential to the gate of the first transistor,
  during another phase, to apply another potential to the gate of the first transistor.

According to one possible embodiment, during the first phase, the first transistor may be placed in the on-state, whereas during the second phase, the first transistor may be placed in the off-state.

The insulating zone 120 may also have a composition and a thickness $e'_c > ec$ in a region R2 situated between the access zones of the first transistor $T_{11}$ and the second transistor $T_{21}$, chosen to make it possible to prevent a parasitic coupling between the respective access zones of the transistors $T_{11}$ and $T_{21}$.

In the example of device illustrated in FIG. 5, a metal contact zone 180 shared between the active zones of the transistors $T_{11}$ and $T_{21}$ is provided. This contact zone may be for example a shared source contact zone 180.

The device also comprises a metal contact zone 182 provided for example for the drain of the second transistor $T_{21}$, as well as a metal contact zone for example for the drain of the first transistor $T_{11}$.

In the example of FIG. 5, the region of the insulating zone 120 separating the access zones of the first transistor and the second transistor is provided, by virtue of its thickness $e'_c$ and its composition, so as to make it possible to limit a parasitic coupling between the access zones of the first transistor $T_{11}$ and the second transistor $T_{21}$.

An example of microelectronic device with two transistors has just been described.

Figure 6:
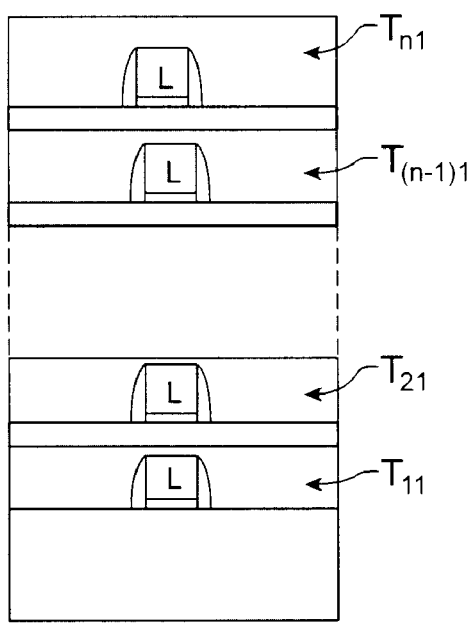
FIG. 6 illustrates an example of microelectronic device according to the invention, with n superimposed transistors, in which n−1 transistors have a channel coupled electrostatically with the gate of a lower level transistor.

A device according to the invention may comprise a higher number of transistors, for example a number n (where n is a whole number such that n>2) of superimposed transistors $T_{11}, T_{21}, T_{(n-1)1}, T_{n1}$, each transistor $T_k$ of a given level $N_k$ (where k is an integer such that 1<k<n) comprising a channel zone capable of being coupled to the gate electrode of a transistor $T_{k-1}$ of level $N_{k-1}$ lower than the given level $N_k$, this gate being situated opposite said channel zone, at a sufficiently low predetermined distance to enable such a coupling (FIG. 6).

Several transistors may be provided within a same level of the device, if necessary several transistors of same type, N or P, or transistors of different types.

In such a device, the semi-conducting channel zone of a transistor is separated from the gate electrode of a lower level transistor $N_{k-1}$ by means of an inter-layer dielectric, the thickness of which is provided sufficiently low to enable a coupling between the gate of the transistor of said lower level $N_{k-1}$ and the channel of the upper level transistor $N_k$. This thickness depends in particular on the voltage range according to which it is wished to modulate the threshold voltage $V_T$ of the upper level transistor.

To implement a microelectronic device according to the invention, it is possible to start from a particular technology, associated with a series of predefined parameters, such as for example the critical gate dimension, the supply voltage range used, then as a function of these predefined parameters are determined the thickness and the material of the insulating zone intended to separate the superimposed transistors in order to enable a suitable coupling (in other words enabling a targeted variation in $V_T$ of at least for example 50 mV). The thickness and the material of the insulating zone may be determined by means of a model such as that defined by the formula (1) given above.

In such a device, the transistor $T_{11}$ of the lowest level $N_1$ has a fixed threshold voltage in so far as it lies directly on the substrate.

Figure 7:
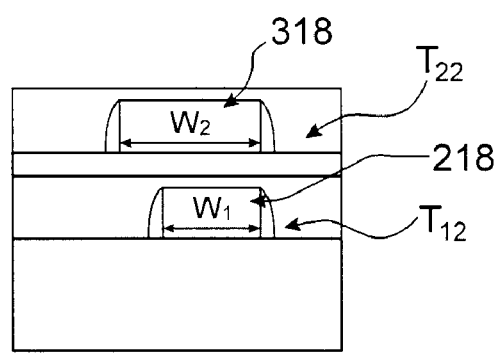
FIG. 7 illustrates an example of microelectronic device according to the invention with 2 superimposed transistors in which the gates have separate axes of symmetry, the channel of the upper level transistor being coupled with the gate of the lower level transistor.

In FIG. 7, an alternative of the example of device described in reference to FIG. 5 is given. For this alternative, superimposed transistors $T_{12}$ and $T_{22}$ have gates 218, 318, the respective centres of which are not aligned in a direction orthogonal to the principal plane of the substrate.

The first transistor $T_{12}$ comprises a gate 218, of width $W_1$, whereas the second transistor $T_{22}$ situated above the first transistor $T_{12}$, is provided with a gate of width $W_2$ greater than that of the first transistor $T_{12}$.

To favour coupling between the gate of the first transistor and the channel zone of the second transistor, the top or upper face of the gate of the first transistor is situated opposite the channel zone of the second transistor, even though the two gates have different widths and are decentred.

Figure 8:
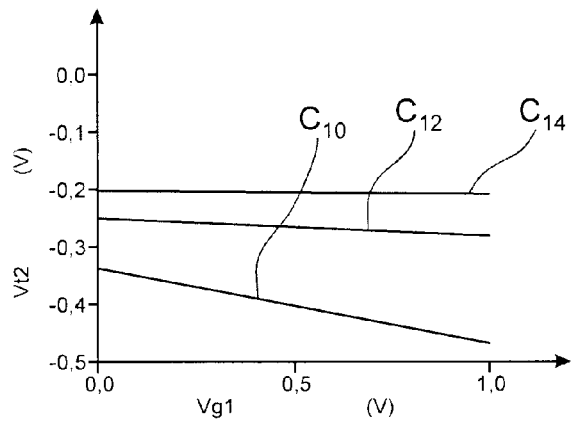
FIG. 8 illustrates the evolution, in an example of pMOS type microelectronic device according to the invention, of the threshold voltage of a transistor of a given level N as a function of the gate potential of a transistor of level N−1 lower than said given level, in comparison with such an evolution, in microelectronic devices also comprising superimposed transistors, but more spaced out from each other.
Figure 9:
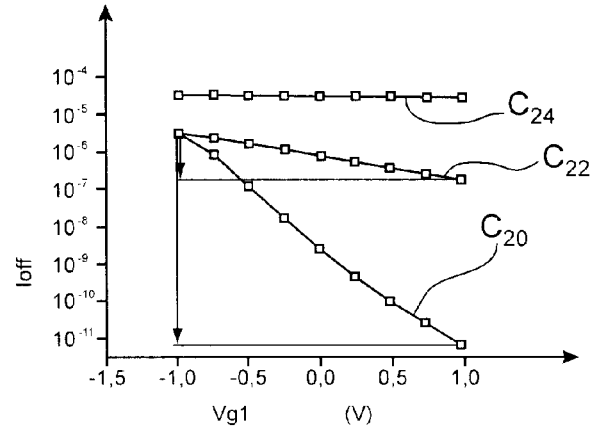
FIG. 9 illustrates the evolution, in an example of pMOS type microelectronic device according to the invention, of the current Ioff in the off-state of a transistor of a given level N as a function of the gate potential of a transistor of level N−1 lower than said given level, as well as the evolution in microelectronic devices also comprising superimposed transistors, but more spaced out from each other.
Figure 10:
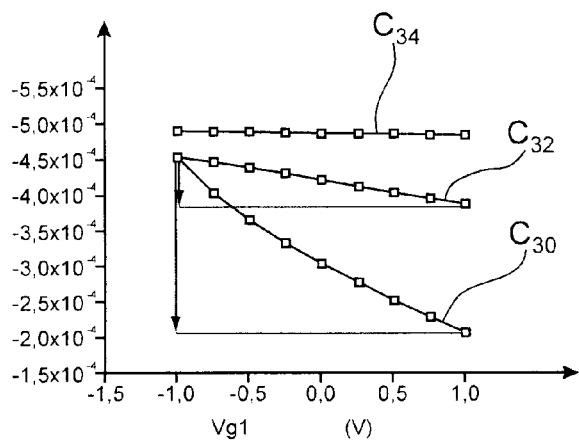
FIG. 10 illustrates the evolution, in an example of pMOS type microelectronic device according to the invention, of the current Ion in the on-state of a transistor of a given level N as a function of the gate potential of a transistor of level N−1 lower than said given level, as well as the evolution of the current Ion in the on-state of a transistor of a given level N as a function of the gate potential of a transistor of level N−1 lower than said given level, in microelectronic devices also comprising superimposed transistors, but more spaced out from each other.

In FIGS. 8 to 10, curves $C_{10}$, $C_{20}$, $C_{30}$, illustrate the phenomenon of coupling in a microelectronic device according to the invention, of the type of that described for example in reference to FIG. 5. The coupling is implemented between a gate of the first transistor $T_{11}$ and the channel of the second transistor $T_{21}$ situated above the first transistor $T_{11}$, the gate of the first transistor and the channel of the second transistor being separated by a thickness of dielectric material, for example around 10 nanometres.

If the gate of the first transistor $T_{11}$ is polarised, and the potential Vg1 applied to this gate is made to vary, for example between 0 and 1 V, a modification in the threshold voltage Vt2 of the second transistor $T_{21}$ is observed. This phenomenon is illustrated on curve $C_{10}$ of FIG. 8. For such a variation in the potential Vg1, a variation in Vt2 of around 130 mV may be obtained.

By way of comparison, curves $C_{12}$ and $C_{14}$ show the evolution of the threshold voltage of transistors in devices of similar layout, but in which the thickness of dielectric $T_{ILD}$ between the gate of the first transistor and the channel zone is greater ($T_{ILD}$=50 nanometres for the device of curve $C_{12}$ and $T_{ILD}$=300 nanometres for that of curve $C_{14}$) and prevents or considerably reduces coupling.

FIG. 9 shows, for its part, that in a device according to the invention and for example of the type of that of FIG. 5, a variation in the potential Vg1 of the gate of the first transistor $T_{11}$, from −1V to 1V, can bring about a variation $\delta I_{OFF}$ in the current $I_{OFF}$ in the off-state, of around 6 decades (curve $C_{20}$ in FIG. 9). By way of comparison, curves $C_{22}$ and $C_{24}$ in this same FIG. 9, show the evolution of the current Ioff of the second transistor of a device of similar layout, but in which the thickness of dielectric $T_{ILD}$ between the gate of the first transistor and the channel zone of the second transistor ($T_{ILD}$=50 nanometres for that of curve $C_{22}$ and $T_{ILD}$=300 nanometres for that of curve $C_{24}$) is higher and prevents or significantly reduces coupling.

FIG. 10 shows, for its part, that in a device according to the invention, for example of the type of that of FIG. 5, a variation in the potential Vg1 of the gate of the first transistor $T_{11}$, from −1V to 1V, can bring about a variation $\delta I_{ON}$ in the current $\delta I_{ON}$ in the channel of the second transistor, of around 53%, when said transistor is in the on-state (curve $C_{30}$ in FIG. 10). By way of comparison, curves $C_{22}$ and $C_{24}$ in this same FIG. 8 show the evolution of the current $I_{ON}$ of the second transistor in devices of similar layout, but in which the respective thicknesses $T_{ILD}$ Of dielectric between the gate of the first transistor and the channel zone ($T_{ILD}$=50 nanometres for curve $C_{22}$ and $T_{ILD}$=300 nanometres for curve $C_{24}$) preventing or significantly reducing the coupling.

A dynamic modification of the threshold voltage $V_T$ of a given transistor of the microelectronic device consists, for example:
- in imposing, during a first phase, by means of a first given potential V1 applied to the gate of another transistor situated below the given transistor, a high threshold voltage VT when the given transistor is in the off-state,
- in imposing, during a second phase, by means of a second given potential V2 applied to the gate of said other transistor, a low threshold voltage VT when the transistor is in the on-state.

Curve $C_{40}$ illustrates the phenomenon of coupling in a microelectronic device according to the invention, between a gate of a first transistor brought to a potential Vg1 varying between −1V and 1V and a channel of a second transistor PMOS situated above the first transistor, the gate of the first transistor and the channel of the second transistor being separated by an equivalent $SiO_2$ thickness of dielectric material of around 10 nanometres.

Curve $C_{42}$ illustrates for its part the phenomenon of coupling in a microelectronic device according to the invention, between a gate of a first transistor brought to a potential Vg1 varying between −1V and 1V and a channel of a second NMOS transistor situated above the first transistor, the gate of the first transistor and the channel of the second transistor being separated by a thickness of dielectric material $T_{ILD}$, for example $SiO_2$ of around 10 nanometres.

In FIG. 12A, the 3 final levels of a microelectronic device according to the invention (of the type of those described previously in reference to FIGS. 5 and 6) with N levels of superimposed transistors are represented.

The gate of the transistor of the N−$1^{th}$ level is linked or connected to polarisation means $410_{N-1}$, which makes it possible to influence, by coupling, the channel potential of the transistor of the upper level N.

Similarly, the gate of the transistor of the N−2 level is linked or connected to polarisation means $410_{N-2}$, which makes it possible to influence, by coupling, the channel potential of the transistor of the N−$1^{th}$ level.

The polarisation means $410_N$ and $410_{N-1}$ are provided to apply a polarisation potential, which may be variable. In this example, the transistors are all functional and can play the role of switch, for example in a memory or in a logic gate. The potential applied may be a positive potential between two given potential values, 0 and Vdd, where Vdd is a supply potential of the device for example around 1 V or 0.1 V.

In FIG. 12B, an alternative of the configuration example that has just been described is given. For this alternative, the superposition of transistors comprises a transistor 500 at the N−$1^{th}$ level which is not used to operate as switch but only as means to vary the potential of the channel of the transistor situated at the $N^{th}$ level, as a function of the manner in which its gate is polarised.

The gate of the transistor 500 situated at the N−$1^{th}$ level is linked or connected to polarisation means $510_{N-1}$, which makes it possible to influence, by coupling, the channel potential of the transistor of the upper level N.

Similarly, the gate of the transistor of the N−$2^{th}$ level is linked or connected to polarisation means $410_{N-2}$, which makes it possible to influence, by coupling, the channel potential of the transistor of the N−$1^{th}$ level.

The polarisation means $510_{N-1}$ are in this example provided to apply a polarisation potential, which may be included in a second range of values of negative and positive potentials, in so far as the transistor 500 is used for the coupling of means of its gate rather than for its function of transistor. The second range of values may be for example between −Vdd and Vdd, where Vdd is the supply potential of the device, for example around 1V or 0.1V.

Similarly, the gate of the transistor of the N−$2^{th}$ level is linked or connected to polarisation means $510_{N-2}$, which makes it possible to influence, by coupling, the channel potential of the transistor of the N−$1^{th}$ level.

The polarisation means $510_{N-2}$ are, in this example, provided to apply a polarisation potential, which may be positive and included in a range of potentials, for example between 0 and Vdd, with Vdd a supply potential of the device.

Another example of microelectronic device according to the invention, with several levels of superimposed transistors, is given in FIG. 13.

This device comprises a first zone Z1, comprising several transistors $T_{10n}$, $T_{10(n-1)}$ the channel zones of which are coupled respectively to the gates of lower level transistors $T_{10(n-1)}$, $T_{10(n-2)}$. Said device also comprises a second zone Z2, comprising several transistors $T_{20n}$, $T_{30(n-1)}$ of a same level in which the channel zones are not coupled to the gates of the lower level transistors $T_{20(n_2)}$, $T_{30(n-2)}$.

Thus the device comprises a first zone Z1 where a coupling between transistors is implemented, and another zone Z2, next to the first zone Z1, where the superimposed transistors are decoupled.

The device may thus comprise a first zone Z1 where a modulation is carried out of the threshold voltage of certain transistors and another zone Z2, next to the first zone Z1, where the transistors have a fixed threshold voltage.

Figure 14:
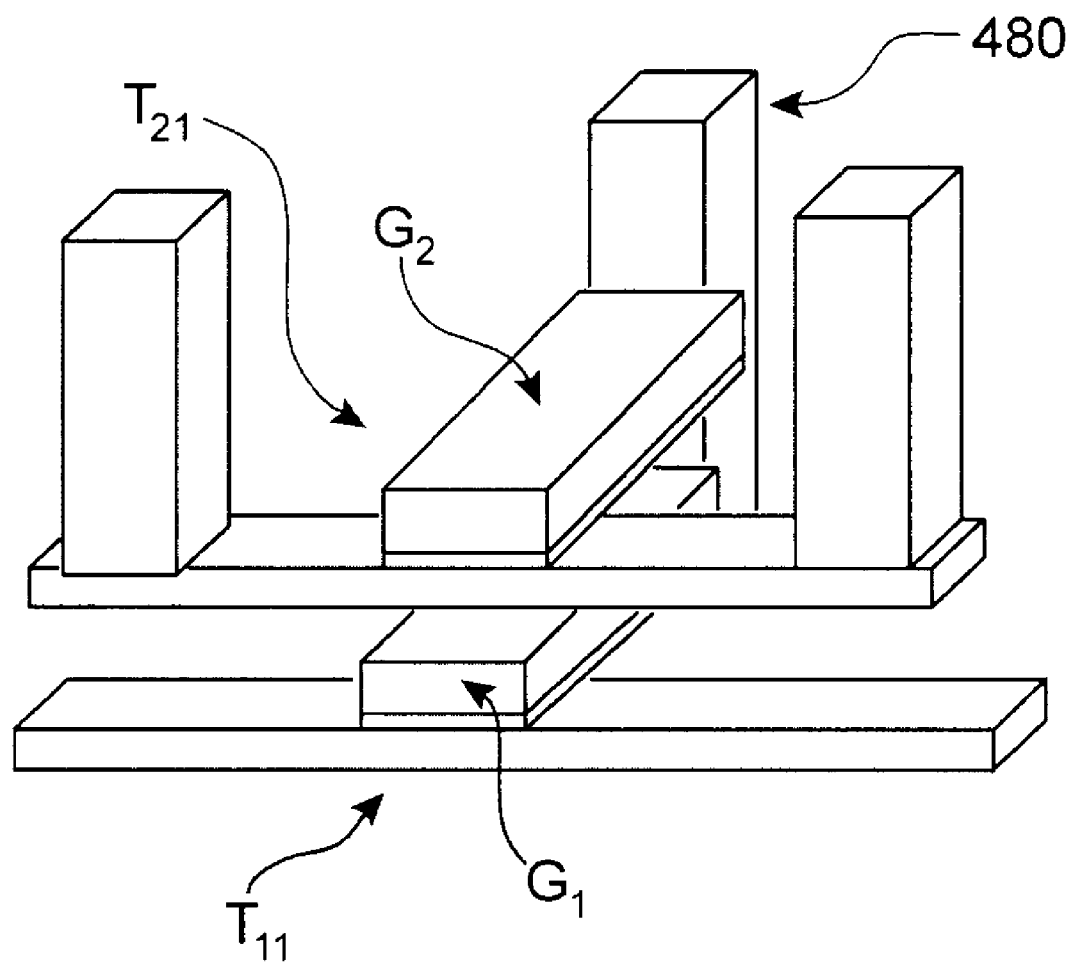
FIG. 14 illustrates an example of microelectronic device according to the invention comprising two superimposed transistors with a contact zone between the gates of the two transistors.

An alternative of the example of device described in reference to FIG. 5 provides a contact zone 480 between the gate G1 of the first transistor $T_{11}$ and the gate G2 of the second transistor $T_{21}$ (FIG. 14).

With such a device, it is possible to obtain a higher current Ion in the channel of the second transistor T21 without increasing the current Ioff in the off-state, by dynamically modifying the threshold voltage of the second transistor T21.

The first transistor T11 may be used as gate for controlling the threshold voltage of the upper level transistor T21.

Indeed, by taking the example of an N-type transistor,

The standard threshold voltage of an nMOS is defined by $Vt_{s,n}$=Vt (Vg1=0).

In the On-State:

The potentials Vg2 and Vg1 applied to the gates G1 and G2 are such that Vg2=Vg1=Vdd.

Figure 11:
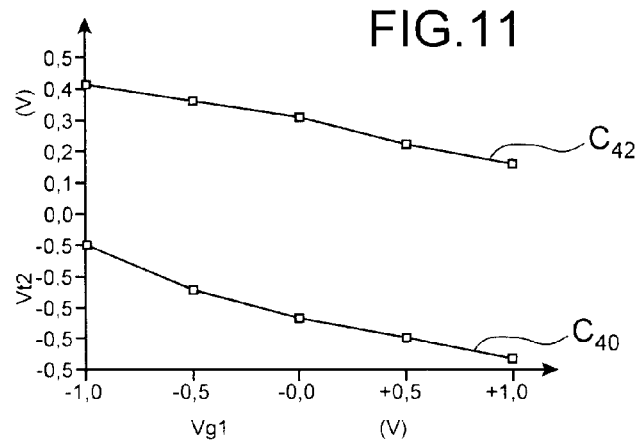
FIG. 11 illustrates the evolution, in a microelectronic device according to the invention, of the threshold voltage of an n-type transistor of a given level N as a function of the gate potential of a p-type transistor of level N−1 lower than said given level, in comparison with the evolution, in a microelectronic device according to the invention, of the threshold voltage of a p-type transistor of a given level N as a function of the gate potential of an n-type transistor of level N−1 lower than said given level.

According to the simulation results of FIG. 11, the threshold voltage of the second transistor T21 is lowered:

$Vt_{on}$<Vt, which makes it possible to obtain a higher current $I_{On}$.

In the Off-State:

The potentials Vg2 and Vg1 applied to the gates G1 and G2 are such that Vg2=Vg1=0.

In this case, the threshold voltage resumes a standard value and the current Ioff remains low.

The proposed structure makes it possible to improve the current in the on-state without degrading the current in the off-state.

A possible application for one or the other of the examples of microelectronic devices is the implementation of improved memory cells, in particular improved SRAM cells.

Such cells may thus comprise a plurality of superimposed transistors, in which one or several transistors have a gate, which, depending on the manner in which it is polarised, makes it possible to modulate the threshold voltage $V_T$ of a transistor in which the channel zone is situated above and opposite said gate, at a distance enabling a coupling between said gate and said channel zone.

An example of method of forming a microelectronic device as described in reference to FIG. 5, will now be given in reference to FIGS. 15A-15C and 16.

On a substrate 100 are firstly (FIG. 15A) formed a transistor structure $T_{11}$ comprising a source region 102, a drain region 104, as well as a channel zone 106, linking the source region 102 and the drain region 104, a gate dielectric zone 107 and a gate 108 on the gate dielectric zone 107. Insulating spacers 111a, 111b may also be formed on either side of the gate 108. The formation of source and drain zones may comprise the formation of highly doped semi-conducting zones 102a, 104a commonly known as HDD (HDD for "highly doped drain"), surmounted by siliconised zones 102b, 104b. Lightly doped access zones 112 to the channel, commonly known as LDD zones (LDD for "lightly doped drain") may also be formed.

Then, the transistor is covered with a layer 113 of dielectric material, for example based on a "high-k" material such as $HfO_2$ or $SiO_2$ (FIG. 15B), which can then be planarised for example by chemical mechanical polishing (CMP).

Then, a semi-conducting layer 110 covered by an insulating layer 111 is transferred, for example by bonding, onto the layer 113, so as to place in contact the insulating layers 111 and 113. The cumulated thickness ec of the insulating layers 111 and 113 above the gate 108, is predetermined, and provided so that a coupling between the gate 108 of the transistor 111 and a channel zone intended to be formed in the semi-conducting layer 110 may be implemented.

Figure 15A:
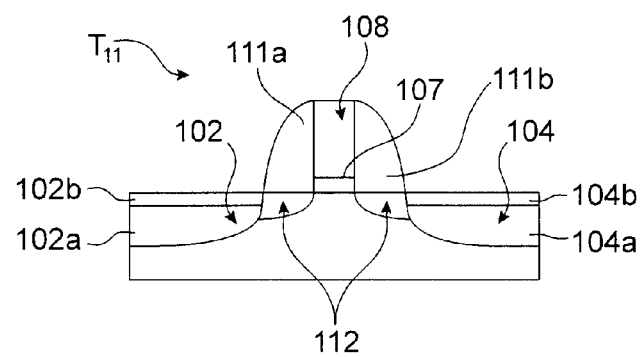
FIGS. 15A-15C and 16 illustrate an example of method of forming a microelectronic device according to the invention.
Figure 15B:
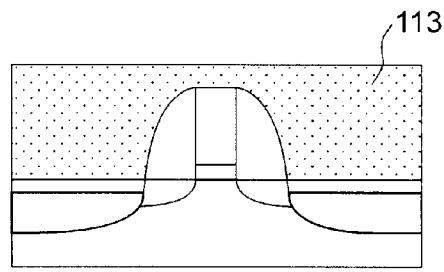
Figure 15C:
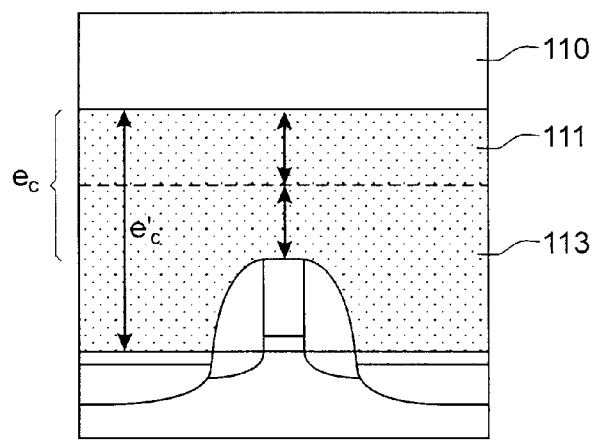

The cumulated equivalent $SiO_2$ thickness may be between 1 and 50 nanometres (FIG. 15C).

Figure 16:
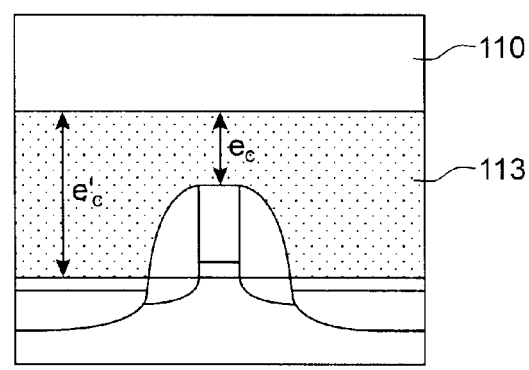

According to one alternative, a semi-conducting layer 110 may be transferred directly onto the layer 113, for example by bonding. The thickness ec of the insulating layer 113 above the gate 108 is then also predetermined, and provided so as to enable, subsequently, a coupling between the gate 108 of the transistor 111 and a channel zone intended to be formed in the semi-conducting layer 110 (FIG. 16).

A microelectronic device with superimposed transistors, implemented according to the invention, will now be described in reference to FIGS. 17 and 18.

This device differs from that described previously in relation to FIG. 5, in that it comprises, between the transistors $T_{11}$ and $T_{21}$, an insulating zone 220 formed of several different dielectric materials 221, 222, in particular having different dielectric constants k1, k2. The thickness and the distribution of said dielectric materials 221, 222, are provided so as to enable a coupling in a first region $R_1$ situated between the gate of the first transistor $T_{11}$ and the channel of the second transistor $T_{21}$, and to limit the coupling between the transistors $T_{11}$ and $T_{21}$ in a region R2 situated around this first region R1.

Figure 17:
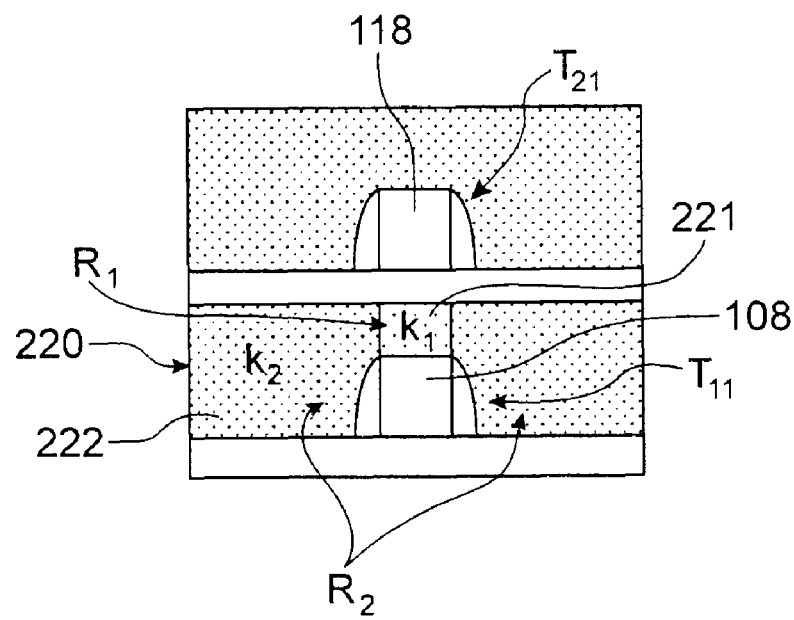
FIG. 17 illustrates an example of microelectronic device according to the invention, with 2 superimposed transistors and separated by an insulating zone comprising several dielectric materials of different dielectric constants, of layout and thicknesses provided so that the channel of the upper level transistor is electrically coupled with the gate of the lower level transistor, the other regions of the upper level transistor not being coupled to the lower level transistor.

A first embodiment is given in FIG. 17, wherein the gate 108 of the first transistor $T_{11}$ and the channel zone 116 of the second transistor $T_{21}$ are separated by a first dielectric material 221 having a first dielectric constant $k_1$.

On either side of this first region R1, above source and drain regions of the first transistor $T_{11}$, the insulating zone 220 is formed based on a second dielectric material 222 having a second dielectric constant $k_2$, such that $k_2<k_1$. The first region R1 may be filled with a "high-k" dielectric material such as for example $HfO_2$ of thickness for example around 40 nanometres, whereas the region situated around this first region may be filled with a dielectric material of thickness for example around 100 nanometres, of lower dielectric constant, such as $SiO_2$.

With such a device, as a function of the manner in which the polarisation of the gate 108 of the first transistor $T_{11}$ is provided, the threshold voltage $V_T$ of the channel of the second transistor $T_{21}$ may be adjusted. The gate of the first transistor $T_{11}$ thus makes it possible to control the channel potential of the upper level transistor $T_{21}$. However the phenomena of coupling of the second transistor $T_{21}$ with the first transistor $T_{11}$ in zones situated outside of the channel of the second transistor $T_{22}$ are avoided. Thus, the access zones of the transistors $T_{11}$ and $T_{21}$ may be fully decoupled from each other.

In this first example, a first block of dielectric material 221 of dielectric constant $k_1$ covers the gate 108 of the lower transistor $T_{11}$. The dielectric material 221 of high permittivity is formed uniquely above the gate 108 of the lower transistor $T_{11}$, whereas blocks of dielectric material 222 of dielectric constant $k_2$ and having a lower permittivity, separate the respective access zones of the transistors $T_{11}$ and $T_{21}$.

The first region R1 thus has, by virtue of its constitution and its thickness, an electric capacitance C1 provided less than the capacitance C2 of the region R2, the constitution and thickness of which are different.

Figure 18:
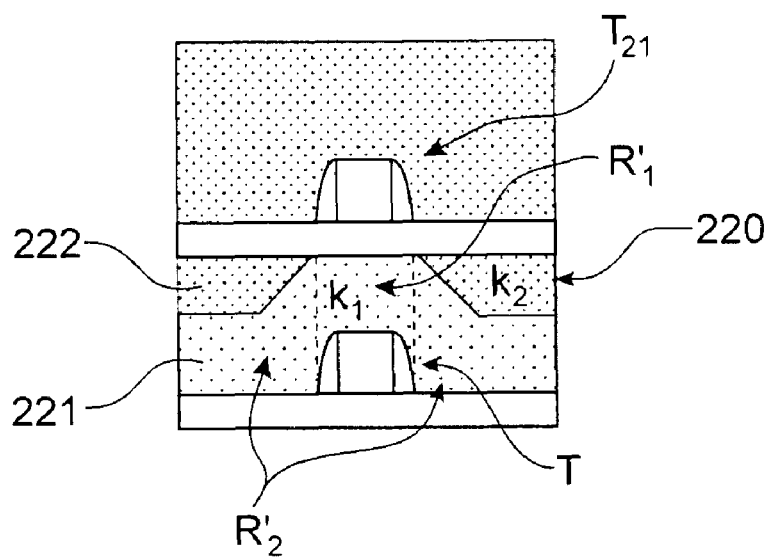
FIG. 18 illustrates an alternative of the example of microelectronic device of FIG. 14, FIGS. 19A-19B illustrate an example of method of forming a microelectronic device according to the invention.

A second embodiment is given in FIG. 18. As in the example described previously in reference to FIG. 17, this device comprises an insulating zone 220 separating the transistors $T_{11}$ and $T_{21}$, formed of several different dielectric materials 221, 222, and in which the thickness and the composition vary depending on the region in which one is situated between the transistors $T_{11}$ and $T_{21}$.

The gate 108 of the first transistor $T_{11}$ and the channel zone 116 of the second transistor $T_{21}$ are separated by a first region R1 based on a first dielectric material 221, for example a dielectric material having a first dielectric constant $k_1$. Around this first region R1, in a region R2 situated above source and drain regions of the first transistor $T_{11}$ are provided insulating blocks formed of a stack of the first dielectric material 221 and a second dielectric material 222 having a second dielectric constant $k_2$, such that $k_2<k_1$. The first dielectric region R1 of the zone 220 thus has, by virtue of its constitution and its thickness, an electric capacitance C1 provided less than the capacitance C2 of the dielectric region R2 of the zone 220, the constitution and the thickness of which are different.

With such a device, as a function of the manner in which the polarisation of the gate 108 of the first transistor $T_{11}$ is provided, the threshold voltage $V_T$ of the channel of the second transistor $T_{21}$ may be adjusted. The gate of the first transistor $T_{11}$ thus makes it possible to control the channel potential of the upper level transistor $T_{21}$. The phenomena of coupling of the second transistor $T_{21}$ with the first transistor $T_{11}$ in the second region R2 are also avoided. The access zones of the transistors $T_{11}$ and $T_{21}$ may thus be fully decoupled from each other.

In the two examples that have just been given, the thickness and the composition of the insulating zone 220 separating the two transistors are variable, and differ between a first region R1 situated between the gate of the first transistor $T_{11}$ and the channel zone of the second transistor, and another region R2 situated around the first region R1 between the access zones of the two transistors $T_{11}$ and $T_{21}$.

The insulating zone 220 has a composition and a thickness in the region R1, chosen so as to enable a significant coupling between the gate 108 of the transistor $T_{11}$ and the channel zone of the transistor $T_{21}$.

The insulating zone 220 has a composition and a thickness in the region R2 situated between the access zones of the first transistor $T_{11}$ and the second transistor $T_{21}$, chosen so as to limit a parasitic coupling between the respective access zones of the transistors $T_{11}$ and $T_{21}$.

A device as described in reference to FIGS. 17 and 18 brings improvements in terms of electrical performance compared to a device with superimposed transistors wherein, a coupling of the gate of a lower transistor with an upper level transistor is implemented, without being concerned with isolating the access zones of the transistors from each other.

Compared to a device as described in reference to FIG. 5, a device having the type of that described in reference to FIGS. 17 and 18 brings improvements in terms of size. In the device described in reference to FIGS. 17 and 18, to obtain the desired coupling effect while at the same time avoiding parasitic couplings, a distance $e'_c$ between the access zones of the transistors T11 and T21, and/or a gate thickness of the transistor T11 and/or a distance ec between the gate of the transistor T11 and the channel of the transistor T21, lower than in the device of FIG. 5, may be provided.

For the device of FIG. 17, when the total dielectric thickness at the level of the region R2 is around 3 times the thickness of the first region R1 and that the first dielectric is a high-k such as $HfO_2$, whereas the second dielectric material is $SiO_2$, it is possible to obtain a capacitance between the gate of the first transistor and the channel of the second transistor around 15 times that between an access zone of the first transistor and an access zone of the second transistor situated above.

Figure 19A:
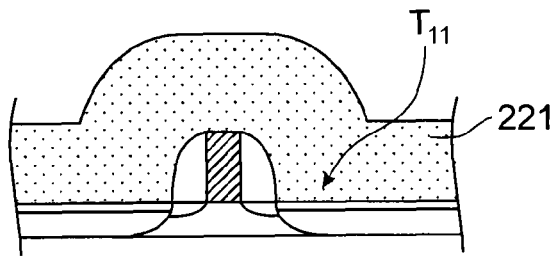
Figure 19B:
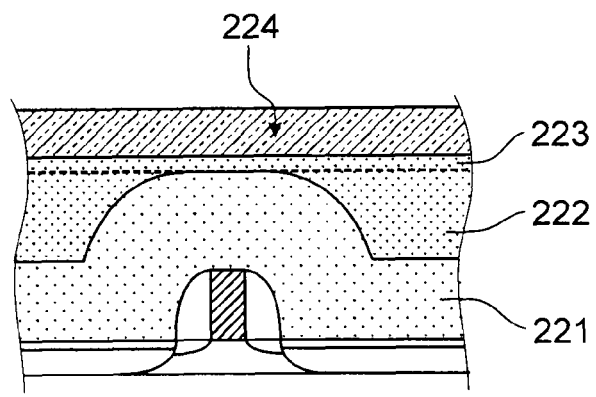

An example of method of forming a microelectronic device as described in reference to FIG. 18, is given in FIGS. 19A-19B.

Firstly, on a substrate 100, is formed a transistor structure $T_{11}$ comprising access zones, in other words a source region and a drain region, as well as a channel zone between the access zones, a gate dielectric zone on the channel zone and a gate on the gate dielectric zone. Insulating spacers may also be formed on either side of the gate 108.

Then, the transistor is covered with a layer of a first dielectric material 221 of dielectric constant $k_1$, for example based on a "high-k" material such as $HfO_2$. The deposition of the first dielectric material 221 may be conformal (FIG. 19A).

Then, a layer of a second dielectric material 222 of dielectric constant $k_2$ is deposited, for example a material 222 of lower permittivity than the first material 221, for example $SiO_2$.

A planarisation of the layer of dielectric material 222 may then be carried out, for example by CMP type polishing. The polishing may be carried out so as to use the layer of dielectric material 221 as stop layer.

Then, a semi-conducting layer is transferred, for example by bonding, which may be covered by an insulating layer 223 so as to place in contact the insulating layer 223 and the layer of dielectric material 222. The insulating layer 223 may be based on the same material as the second dielectric material. The cumulated insulating thickness above the gate of the transistor $T_{11}$ is predetermined and provided so that a coupling between the gate of the transistor and a channel zone intended to be formed in the semi-conducting layer 224 may be implemented.

According to an alternative, the semi-conducting layer may be transferred directly onto the layer of dielectric material 222, for example by bonding.

Figure 20A:
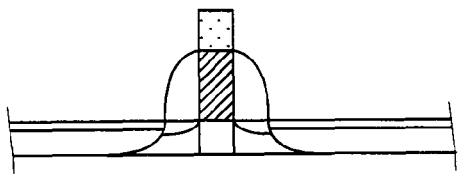
FIGS. 20A-20C illustrate an example of method of forming a microelectronic device according to the invention.
Figure 20B:
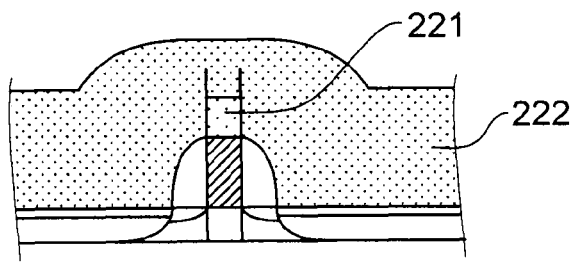
Figure 20C:
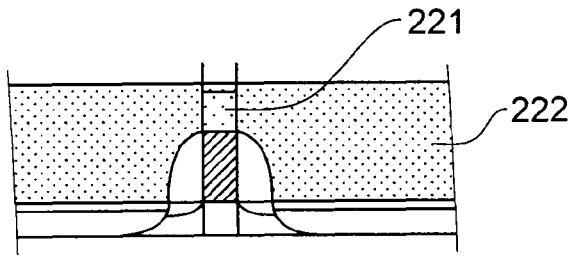

Another example of method of forming a microelectronic device as described in reference to FIG. 17 is given in FIGS. 20A-20C.

A transistor structure $T_{11}$ is firstly formed on a substrate 100.

Then, the transistor is covered with a layer of a first dielectric material 221 of dielectric constant $k_1$, for example by conformal deposition of a "high-k" material such as $HfO_2$.

Then the dielectric material 221 is etched, so as to remove this material 221 from the access zones of the transistor, and to retain a block of dielectric material 221 uniquely on the gate of the transistor $T_{11}$ (FIG. 20A).

Then, a layer of a second dielectric material 222 of dielectric constant $k_2$ is deposited, for example a material 222 of lower permittivity than the first material 221, for example $SiO_2$. The deposition may be conformal and carried out so as to cover the access zones of the transistor T11, as well as the block of dielectric material 221 formed on the gate of the transistor (FIG. 20B).

A planarisation of the layer of dielectric material 222 may then be carried out, for example by CMP type polishing (FIG. 20C). The polishing may be carried out so as to use the layer of dielectric material 221 as stop layer.

Then, a semi-conducting layer is transferred, for example by bonding, from which is then formed the second transistor (steps not represented).

The invention claimed is:

1. A microelectronic device comprising:
   a substrate surmounted by a stack of layers,
   at least one first transistor situated at a given level of said stack,
   at least one second transistor situated at a second level of said stack, above said given level, the first transistor comprising a gate electrode situated opposite a channel zone of the second transistor, the first transistor and the second transistor being separated by an insulating zone,
   said insulating zone being constituted of several different dielectric materials including a first dielectric material and a second dielectric material, and having in a first region extending from a top surface of said gate electrode of said first transistor to a bottom surface of said channel of said second transistor, a composition and a thickness provided so as to form a first electric capacitance C1 between the gate electrode of the first transistor and the channel of the second transistor, said first region only including the first dielectric material, said insulating zone comprising a second region that includes the second dielectric material extending from a bottom of the channel of the second transistor to a top surface of at least one access zone of the first transistor and having a thickness so as to form a second electric capacitance C2 between said access zone of the first transistor an access zone of the second transistor, such that C2<C1.

2. The microelectronic device according to claim 1, wherein said first region is formed only of the first dielectric material having a first dielectric constant $k_1$, and the second region is formed of the second dielectric material having a second dielectric constant $k_2$ such that $k_2<k_1$.

3. The microelectronic device according to claim 1, wherein said first region of the insulating zone has an equivalent $SiO_2$ thickness between 1 and 50 nanometres.

4. The microelectronic device according to claim 1, wherein a channel zone of the first transistor is situated fully opposite a gate electrode of the second transistor.

5. The microelectronic device according to claim 1, further comprising, in an axis orthogonal to a principal plane of the substrate passing through the gate electrode of the first transistor and the second transistor, one or several other transistors.

6. The microelectronic device according to claim 1, further comprising:
  at least one third transistor situated at the level of said first transistor in said stack, and
  at least one fourth transistor situated above the third transistor, the fourth transistor and the third transistor being separated by a dielectric zone provided to limit or prevent a coupling between the third transistor and the fourth transistor.

7. The microelectronic device according to claim 1, further comprising:
  at least one third transistor situated at the level of said first transistor in said stack,
  at least one fourth transistor, and
  a fifth decoupling transistor situated between the third transistor and the fourth transistor.

8. The device according to claim 1, further comprising:
  one or several other transistors in a plane parallel to a principal plane of the substrate and passing through at least one of the gate electrode of the first transistor and a gate electrode of the second transistor.

9. The microelectronic device according to claim 1, further comprising at least one contact pad between the gate electrode of the first transistor and a gate electrode of the second transistor.

10. The microelectronic device according to claim 1, wherein the transistors belong to a SRAM memory cell.

11. The microelectronic device according to claim 1, wherein the first region has width equal to a width of the gate electrode of the first transistor.

12. The microelectronic device according to claim 1, further comprising:
  means for modulating a threshold voltage of the second transistor, including means for applying a variable potential to said gate electrode of said first transistor and
    to apply to the gate electrode of the first transistor, during a first phase, at least one first potential, and
    to apply to the gate electrode of the first transistor, during a second phase, at least one second potential, different from said first potential.

13. The microelectronic device according to claim 12, wherein said first potential is provided to turn on said second transistor and impose a first threshold voltage on the second transistor, and said second potential is provided to turn off said second transistor and impose a second threshold voltage, greater than said first threshold voltage.

14. The microelectronic device according to claim 1, wherein said insulating zone has in the first region a composition and a thickness that enables a coupling between the gate electrode of the first transistor and the channel of the second transistor.

15. The microelectronic device according to claim 14, wherein said insulating zone has, in the second region between said access zone of said first transistor and said access zone of said second transistor, a composition and a thickness that limits or prevents a coupling between said access zone of the first transistor and said access zone of the second transistor.

16. The microelectronic device according to claim 14, wherein the coupling between the gate electrode of the first transistor and the channel of the second transistor is such that a variation in gate potential of the first transistor brings a variation in threshold voltage of the second transistor.

17. The microelectronic device according to claim 16, wherein Vdd is a supply voltage of the microelectronic device, and the coupling between the gate electrode of the first transistor and the channel of the second transistor is such that a variation in the gate potential of the first transistor obtains the variation in the threshold voltage of the second transistor of at least 50 mV.

18. The microelectronic device according to claim 17, wherein said gate potential varies between 0 and Vdd or between −Vdd and +Vdd.

19. A microelectronic device comprising:
  a substrate surmounted by a stack of layers,
  at least one first transistor situated at a given level of said stack,
  at least one second transistor situated at a second level of said stack, above said given level, the first transistor comprising a gate electrode situated opposite a channel zone of the second transistor, the first transistor and the second transistor being separated by an insulating zone,
  said insulating zone being constituted of several different dielectric materials including a first dielectric material and a second dielectric material, and having in a first region extending from a top surface of said gate electrode of said first transistor to a bottom surface of said channel of said second transistor, a composition and a thickness provided so as to form a first electric capacitance C1 between the gate electrode of the first transistor and the channel of the second transistor, said first region is formed only of the first dielectric material having a first dielectric constant $k_1$, said insulating zone comprising a second region that extends from a bottom of the channel of the second transistor to a top surface of at least one access zone of the first transistor and that includes a stack of the first dielectric material and the second dielectric material having a second dielectric constant $k_2$ such that $k_2<k_1$, the second region having a thickness so as to form a second electric capacitance C2 between said access zone of the first transistor and an access zone of the second transistor, such that C2<C1.

* * * * *